United States Patent
Dong

(10) Patent No.: US 10,806,025 B2
(45) Date of Patent: Oct. 13, 2020

(54) FOLDABLE DISPLAY DEVICE

(71) Applicant: BOE TECHNOLOGY GROUP CO., LTD., Beijing (CN)

(72) Inventor: Tian Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 4 days.

(21) Appl. No.: 15/739,287

(22) PCT Filed: Jun. 28, 2017

(86) PCT No.: PCT/CN2017/090547
§ 371 (c)(1),
(2) Date: Dec. 22, 2017

(87) PCT Pub. No.: WO2018/072466
PCT Pub. Date: Apr. 26, 2018

(65) Prior Publication Data
US 2020/0037433 A1 Jan. 30, 2020

(30) Foreign Application Priority Data
Oct. 21, 2016 (CN) .......................... 2016 1 0921745

(51) Int. Cl.
*G06F 1/16* (2006.01)
*H05K 1/02* (2006.01)
(Continued)

(52) U.S. Cl.
CPC ............ *H05K 1/028* (2013.01); *H05K 1/118* (2013.01); *H05K 1/147* (2013.01); *H05K 5/0017* (2013.01); *H05K 5/0221* (2013.01)

(58) Field of Classification Search
CPC ....................................................... H05K 5/00
See application file for complete search history.

(56) References Cited

U.S. PATENT DOCUMENTS

2002/0104769 A1   8/2002   Kim et al.
2004/0264118 A1   12/2004  Karidis et al.
(Continued)

FOREIGN PATENT DOCUMENTS

CN          1383503 A       12/2002
CN          103294113 A     9/2013
(Continued)

OTHER PUBLICATIONS

First Office Action for Chinese Application No. 201610921745.0, dated Jun. 30, 2017, 5 Pages.
(Continued)

*Primary Examiner* — Jerry Wu
(74) *Attorney, Agent, or Firm* — Brooks Kushman P.C.

(57) ABSTRACT

A foldable display device is provided. The foldable display device includes a flexible display panel including a first display region, a second display region and a bending region and having a first state and a second state; and a first panel supporting frame and a second panel supporting frame configured to support the first display region and the second display region, respectively. In the first state, the first and the second panel supporting frames overlap with each other; and in the second state, the first and the second panel supporting frames are in a same plane and form an accommodation space in which the bending region is accommodated, and a first border of the first display region and a fifth border of the second display region abut against and are in contact with each other to form a structure of flat panel display.

16 Claims, 3 Drawing Sheets

(51) Int. Cl.
*H05K 1/11* (2006.01)
*H05K 1/14* (2006.01)
*H05K 5/00* (2006.01)
*H05K 5/02* (2006.01)

(56) References Cited

U.S. PATENT DOCUMENTS

| | | |
|---|---|---|
| 2012/0307423 A1 | 12/2012 | Bohn et al. |
| 2013/0342090 A1 | 12/2013 | Ahn et al. |
| 2015/0255023 A1 | 9/2015 | Lee et al. |
| 2015/0257289 A1 | 9/2015 | Lee et al. |
| 2015/0378397 A1* | 12/2015 | Park ............... G06F 1/1652 361/679.27 |
| 2017/0013729 A1* | 1/2017 | Rothkopf ............. H05K 5/0226 |
| 2017/0177035 A1 | 6/2017 | Song |

FOREIGN PATENT DOCUMENTS

| | | |
|---|---|---|
| CN | 103620516 A | 3/2014 |
| CN | 104900152 A | 9/2015 |
| CN | 104900153 A | 9/2015 |
| CN | 104900156 A | 9/2015 |
| CN | 106448466 A | 2/2017 |

OTHER PUBLICATIONS

International Search Report and Written Opinion for Application No. PCT/CN2017/090547, dated Sep. 28, 2017, 11 Pages.
Search Report for Chinese Application No. 201610921745.0, dated Apr. 28, 2017, 6 Pages.

* cited by examiner

FOLDABLE DISPLAY DEVICE

CROSS-REFERENCE TO RELATED APPLICATIONS

This application is the U.S. national phase of PCT Application No. PCT/CN2017/090547 filed on Jun. 28, 2017, which claims priority to Chinese Patent Application No. 201610921745.0 filed on Oct. 21, 2016, which are incorporated herein by reference in their entireties.

TECHNICAL FIELD

The present disclosure relates to the field of display technology, and more particularly to a foldable display device.

BACKGROUND

With continuous development of the display technology and in order to satisfy different usage requirements, various display products having different features have also emerged. A foldable flexible display device is such a type of new display device having flexibility. When a user wants to use the foldable flexible display device, a flexible display screen of the whole foldable flexible display device may be unfolded to completely unfold the foldable flexible display screen, thus causing the foldable flexible display screen to have a larger display screen. The foldable flexible display screen may be folded when the user wants to carry it. Although a size of the display screen may be sacrificed, portability when carrying it may be effectively improved because the display screen after being folded may have a smaller size.

In the case that a resolution of the foldable flexible display screen is high, requirements of the whole foldable flexible display screen (panel) may not be satisfied by one driver IC, and therefore two driver ICs need to be adopted. However, when folding a foldable flexible display screen driven by two driver ICs, a folding direction may be limited, and the folding may be performed only along a direction perpendicular to the driver ICs. In the case that the display screen is driven together by a gate driving circuit of Gate on Array (GOA) on the display screen, a problem that a bending portion of the display screen is difficult to be driven to display is remarkable, and a seamless display may not be realized when implementing a full-screen display.

SUMMARY

In a first aspect, the present disclosure provides a foldable display device. The foldable display device includes a flexible display panel, a first panel supporting frame and a second panel supporting frame. The flexible display panel includes a first display region, a second display region and a bending region formed between the first display region and the second display region. The first panel supporting frame is configured to support the first display region, and the second panel supporting frame is configured to support the second display region, wherein the first panel supporting frame and the second panel supporting frame make the flexible display panel have a first state and a second state. In the first state, the first panel supporting frame and the second panel supporting frame overlap with each other and are directly in contact with each other, and the bending region is in a first bended-shape, and the first display region and the second display region overlap with each other and are not directly in contact with each other. In the second state, a surface of the first panel supporting frame in contact with the first display region and a surface of the second panel supporting frame in contact with the second display region are in a same plane, and an accommodation space is formed between the first panel supporting frame and the second panel supporting frame; the bending region is in a second bended-shape and is accommodated in the accommodation space, and a first border of the first display region and a fifth border of the second display region abut against each other and are in contact with each other to form a structure of flat panel display.

Furthermore, the first panel supporting frame is on a display back surface of the first display region, and the second panel supporting frame is on a display back surface of the second display region.

Furthermore, the bending region is not configured for display, and includes a metal connection wire.

Furthermore, the flexible display panel further includes a first gate driving circuit for driving the first display region, and a second gate driving circuit for driving the second display region and being different from the first gate driving circuit.

Furthermore, the first gate driving circuit is in a vicinity of a second border opposite to the first border of the first display region, and the second gate driving circuit is in a vicinity of a sixth border opposite to the fifth border of the second display region.

Furthermore, at least one of the first gate driving circuit and the second gate driving circuit is in the bending region.

Furthermore, the foldable display device includes a first locking mechanism being on a first side surface of the first panel supporting frame adjacent to the bending region and a third side surface of the second panel supporting frame adjacent to the bending region, and configured to lock the first panel supporting frame and the second panel supporting frame in the second state.

Furthermore, the first locking mechanism includes a locking slot being on the first side surface of the first panel supporting frame, and a locking rod, wherein a first end of the locking rod is on the third side surface of the second panel supporting frame and a second end of the locking rod is configured to be capable of being inserted into or pulled out of the locking slot, wherein in the first state, the second end of the locking rod is pulled out of the locking slot; and in the second state, the second end of the locking rod is inserted into the locking slot so as to lock the first panel supporting frame and the second panel supporting frame.

Furthermore, in the first state, the locking rod is capable of being accommodated in a space formed when the bending region is in the first bended-shape; and in the second state, the locking rod is capable of being supported between the first panel supporting frame and the second panel supporting frame such that the first border of the first display region and the fifth border of the second display region abut against each other and are in contact with each other to form the structure of flat panel display.

Furthermore, the locking slot is a deformable slot formed of an elastic and deformable material, and the second end of the locking rod is provided with a rigid ball formed of a rigid material, and an external diameter of the rigid ball is larger than an inner diameter of the locking slot.

Furthermore, the locking slot is a non-deformable slot formed of a rigid material, and the second end of the locking rod is provided with an elastic ball formed of an elastic and deformable material, and an external diameter of the elastic ball is larger than an inner diameter of the locking slot.

Furthermore, the locking rod is a stretch-retraction rod structure capable of being stretched and retracted.

Furthermore, in the first state, a display back surface of the first display region and a display back surface of the second display region face towards each other so as to cause the flexible display panel to perform double-screen display, and the bending region has a width enabling the first panel supporting frame and the second panel supporting frame to completely overlap with each other and be attached with each other in the first state.

Furthermore, the flexible display panel further includes a third state, and in the third state, the first panel supporting frame and the second panel supporting frame overlap with each other, and the bending region is in a third bended-shape, and a display surface of the first display region and a display surface of the second display region overlap with each other and are directly in contact with each other so as to make the flexible display panel not perform display.

Furthermore, the flexible display panel further includes a second locking mechanism, the first panel supporting frame includes a second side surface facing away from the second panel supporting frame in the second state, and the second panel supporting frame includes a fourth side surface facing away from the first panel supporting frame in the second state; wherein the second locking mechanism is on the second side surface and the fourth side surface, and is configured to lock the first panel supporting frame and the second panel supporting frame in the first state.

BRIEF DESCRIPTION OF THE DRAWINGS

In order to make technical solutions in embodiments of the present disclosure or related arts more apparent, drawings used in description of the embodiments may be briefly described hereinafter. Obviously, the drawings in the following descriptions are merely some of the embodiments of the present disclosure, and based on these drawings, a person skilled in the art may also obtain other drawings without paying any creative labors.

DETAILED DESCRIPTION

Figure 1:
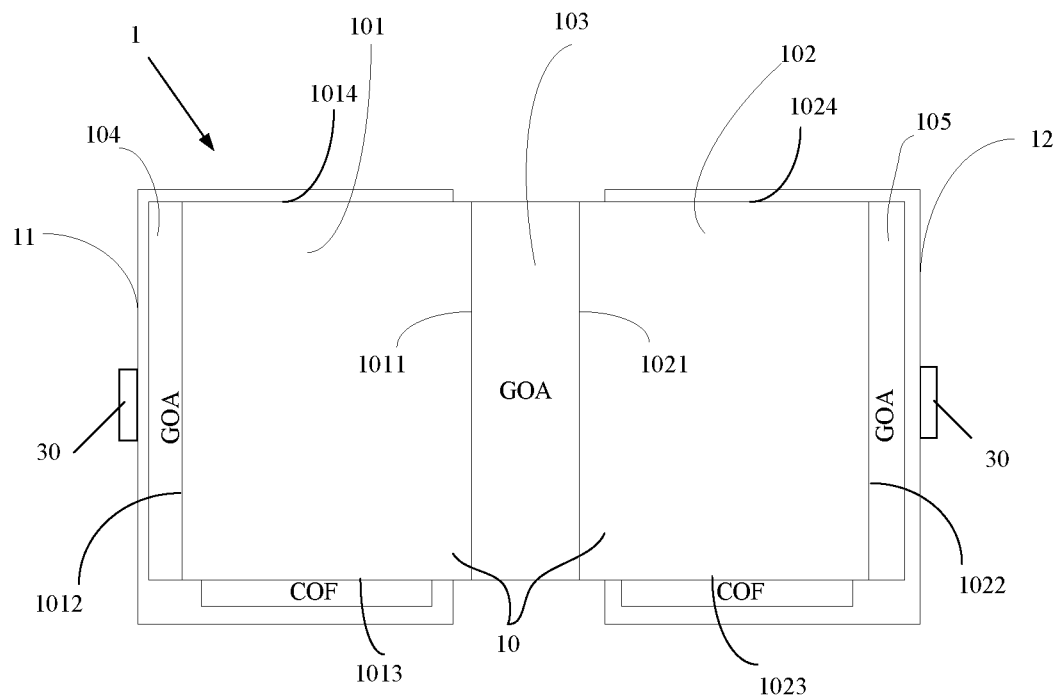
FIG. 1 is a front view of a foldable display device in an unfolded state provided by the embodiments of the present disclosure.

In order to make objectives, technical solutions and advantages of the embodiments of the present disclosure more clear, the technical solutions of the embodiments of the present disclosure may be described hereinafter clearly and completely in conjunction with the drawings of the embodiments of the present disclosure. Obviously, the described embodiments are merely a part of, rather than all of, the embodiments of the present disclosure. Based on these embodiments, all of other embodiments obtained by a person skilled in the art without paying any creative effort also fall within the scope of the present disclosure.

As shown in FIG. 1 to FIG. 4, the present disclosure provides a foldable display device 1. The foldable display device 1 includes a flexible display panel 10, a first panel supporting frame 11 and a second panel supporting frame 12. The flexible display panel 10 includes a first display region 101, a second display region 102 and a bending region 103 formed between the first display region 101 and the second display region 102. The bending region 103 is connected with a first border 1011 of the first display region 101 and a fifth border 1021 of the second display region 102. The first panel supporting frame 11 is configured to support the first display region 101 and is directly in contact with a display back surface of the first display region 101, and the second panel supporting frame 12 is configured to support the second display region 102 and is directly in contact with a display back surface of the second display region 102. The first panel supporting frame 11 and the second panel supporting frame 12 may overlap with each other or may be unfolded relative to each other, such that the flexible display panel 10 has a first state and a second state. The first state is a state in which the flexible display panel 10 is completely folded, and the second state is a state in which the flexible display panel 10 is completely unfolded.

In the first state, the first panel supporting frame 11 and the second panel supporting frame 12 overlap with each other and are directly in contact with each other, and the bending region 103 in in a first bended shape, and the first display region 101 and the second display region 102 also overlap with each other and are parallel to each other. In the second state, a surface of the first panel supporting frame 11 in contact with the first display region 101 and a surface of the second panel supporting frame 12 in contact with the second display region 102 are in a same plane, and an accommodation space is formed between the first panel supporting frame 11 and the second panel supporting frame 12; and the bending region 103 is in a second bended shape and accommodated in the accommodation space, and the first border 1011 of the first display region 101 and the fifth border 1021 of the second display region 102 abut against each other and are in contact with each other to form a structure of a flat panel display.

In this embodiment, the first border 1011 of the first display region 101 is a border at which the first display region 101 and the bending region 103 are connected to each other, the fifth border 1021 of the second display region 102 is a border at which the second display region 102 and the bending region 103 are connected to each other, and the first border 1011 protrudes out of the first panel supporting frame 11 and the fifth border 1021 protrudes out of the second panel supporting frame 12, such that, when the first border 1011 and the fifth border 1021 abut against each other and are in contact with each other in the second state, the accommodation space may be formed between the first panel supporting frame 11 and the second panel supporting frame 12.

Figure 3:
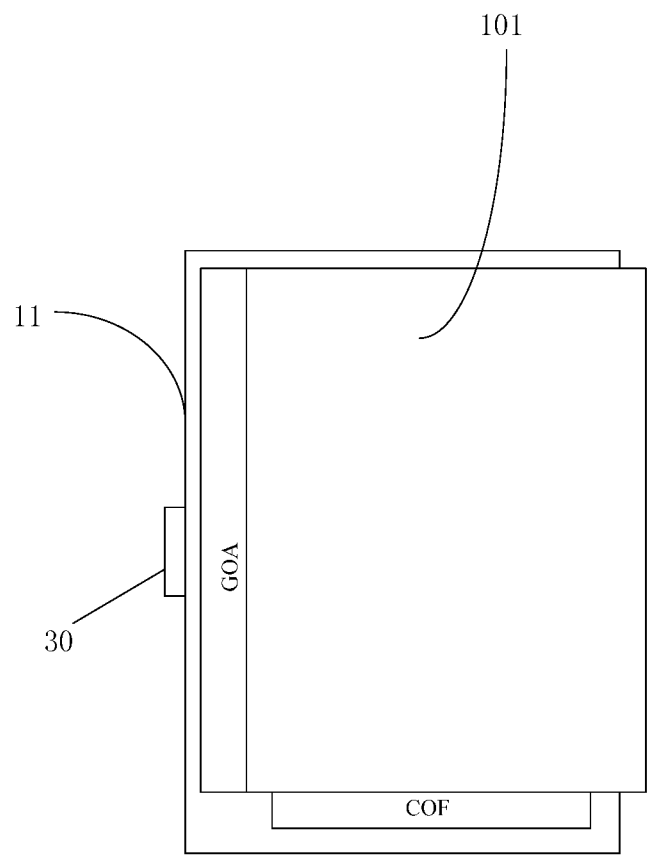
FIG. 3 is a front view of the foldable display device in a folded state provided by the embodiments of the present disclosure.
Figure 4:
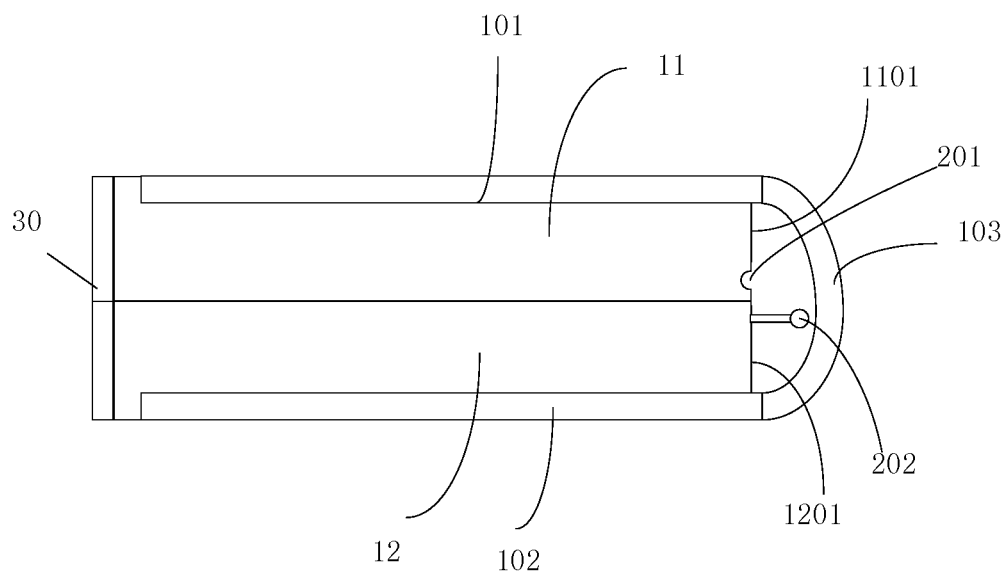
FIG. 4 is a side view of the foldable display device in the folded state shown in FIG. 3.

When folding, as shown in FIG. 3 and FIG. 4, the first panel supporting frame 11 and the second panel supporting frame 12 are caused to overlap with each other and be directly in contact with each other, so that the first display region 101 and the second display region 102 may also overlap with each other (as seen from a direction perpendicular to the first display region 101 and the second display region 102). In such a case, the bending region 103 of the flexible display panel 10 as a bending portion may not reduce display areas of the first display region 101 and the second display region 102, and since the flexible display panel 10 has a certain thickness and tensile force in itself, a bending radius is naturally formed in the bending region 103 to realize the folding state when folding.

Figure 2:
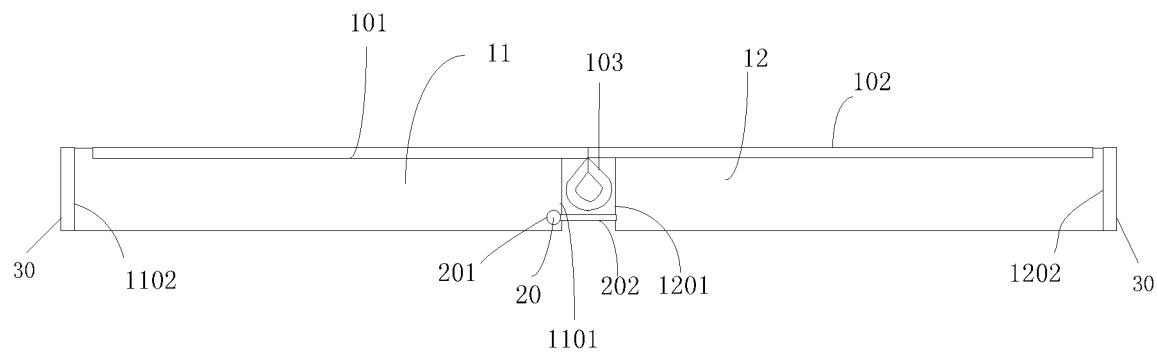
FIG. 2 is a side view of the foldable display device shown in FIG. 1 when performing a full-screen display.

When unfolding, as shown in FIG. 1 and FIG. 2, the first panel supporting frame 11 and the second panel supporting frame 12 are separated from each other, and the first border 1011 of the first display region 101 and the fifth border 1021 of the second display region 102 abut against each other and are in contact with each other to form the structure of the flat panel display. The bending region 103 is accommodated in the accommodation space formed by the first panel supporting frame 11 and the second panel supporting frame 12. The bending region 103 does not perform display, and may not result in a partition between the first display region 101 and the second display region 102, thus realizing the seamless display.

It can be seen from the above that the foldable display device provided by the present disclosure may solve the problem that the bending portion of the foldable display device in the related art is difficult to be driven to display, and may realize the seamless display in the full-screen display.

Optionally, as shown in FIG. 1, the flexible display panel 10 further includes a first gate driving circuit 104 for driving the first display region 101 and a second gate driving circuit 105 for driving the second display region 102. The first gate driving circuit 104 may be in a vicinity of a second border 1012 which is opposite to the first border 1011 of the first display region 101, and the second gate driving circuit 105 is in a vicinity of a sixth border 1022 which is opposite to the fifth border 1021 of the second display region 102. In addition, at least one of the first gate driving circuit 104 and the second gate driving circuit 105 may also be in the bending region 103. In the embodiments of the present disclosure, each of the first gate driving circuit 104 and the second gate driving circuit 105 may be one of a driver IC (Integrated Circuit) and a Gate on Array (GOA).

In the above solutions, the flexible display panel 10 is divided into the first display region 101 and the second display region 102 for display, and the first display region 101 and the second display region 102 are driven by different driving circuits (i.e., driven separately). That is, the first display region 101 and the second display region 102 may be driven by separated integrated circuits and Gate on Arrays (GOAs), respectively. The bending region 103 may not be used for display, and may include at least one of a metal connection wire and the GOA to prevent the flexible display panel 10 from being damaged when performing the full-screen display.

In the embodiments provided by the present disclosure, optionally, the foldable display device 1 further includes a first locking mechanism 20 which is on the first panel supporting frame 11 and the second panel supporting frame 12. The first locking mechanism 20 is configured to lock the first panel supporting frame 11 and the second panel supporting frame 12 when the flexible display panel 10 is in the second state.

In embodiments provided by the present disclosure, optionally, as shown in FIG. 2 and FIG. 4, the first locking mechanism 20 includes a locking slot 201 and a locking rod 202. The locking slot 201 is on a first side surface 1101 of the first panel supporting frame 11 adjacent to the bending region 103. A first end of the locking rod 202 is on a third side surface 1201 of the second panel supporting frame 12 adjacent to bending region 103, and a second end of the locking rod 202 is to be capable of being inserted into or pulled out of the locking slot 201. In the first state of the flexible display panel 10, the second end of the locking rod 202 is pulled out of the locking slot 201, and in the second state of the flexible display panel 10, the second end of the locking rod 202 is inserted into the locking slot 201 so as to lock the first panel supporting frame 11 and the second panel supporting frame 12. According to the above solution, the first locking mechanism 20 adopts a structure of fitting the locking rod 202 to the locking slot 201, which is simple and easy to be operated.

Optionally, as shown in FIG. 2 and FIG. 4, in the first state of the flexible display panel 10, the locking rod 202 is capable of being accommodated in a space formed by the first panel supporting frame 11, the second panel supporting frame 13, and the bending region 103 together when the bending region 103 is in the first bended-shape. In the second state of the flexible display panel 10, the locking rod 202 is capable of being supported between the first panel supporting frame 11 and the second panel supporting frame 12.

In the above solution, when the foldable display device 1 needs to perform the full-screen display, the first panel supporting frame 11 and the second panel supporting frame 12 are unfolded relative to each other, the first border 1011 of the first display region 101 and the fifth border 1021 of the second display region 102 abut against each other and are in contact with each other, and the bending region 103 is accommodated in the accommodation space formed by the first panel supporting frame 11 and the second panel supporting frame 12. The second end of the locking rod 202 being on the second panel supporting frame 12 is inserted into the locking slot 201 on the first panel supporting frame 11, and the locking rod 202 is supported between the first panel supporting frame 11 and the second panel supporting frame 12, thus realizing the seamless display and the full-screen display.

When the foldable display device 1 needs to be folded, the second end of the locking rod 202 is pulled out of the locking slot 201, and the first panel supporting frame 11 and the second panel supporting frame 12 overlap with each other. The bending region 103 of the flexible display panel 10 is bent, and the locking rod 202 is accommodated in the space formed by the first panel supporting frame 11, the second panel supporting frame 12, and the bending region 103, thus realizing a folded double-screen display.

According to the above solution, on the one hand, the locking rod 202 may have a locking function, and on the other hand, the locking rod 202 may also be supported between the first panel supporting frame 11 and the second panel supporting frame 12 to define the accommodation space for accommodating the bending region 103.

It should be noted that, in practical application, specific implementations of the first locking mechanism 20 may not be limited thereto, and may also be realized by other structures which are not enumerated herein.

In addition, in the embodiments provided by the present disclosure, optionally, the locking slot 201 is a deformable slot made of an elastic and deformable material, and the second end of the locking rod 202 is provided with a rigid ball which is made of a rigid material and an external diameter of which is larger than an inner diameter of the locking slot 201. Optionally, the locking slot 201 is a non-deformable slot made of a rigid material, and the second end of the locking rod 202 is provided with an elastic and deformable ball which is made of an elastic and deformable material and an external diameter of which is larger than an inner diameter of the locking slot 201. According to the above solution, one of the locking rod 202 and the locking slot 201 is made of the elastic and deformable material (e.g., an elastic rubber), and the other of the locking rod 202 and the locking slot 201 is made of the rigid material, such that the locking rod 202 is capable of being inserted into or pulled out of the locking slot 201, and the structure of fitting the locking rod to the locking slot is simple and easy to be operated.

In addition, in the embodiments provided by the present disclosure, optionally, the locking rod 202 may be a stretch-retraction rod structure which is stretchable and retractable.

According to the above solution, the locking rod 202 is designed as the stretch-retraction rod structure and is capable of being inserted into the locking slot 201 conveniently when the foldable display device 1 is unfolded, and may be retracted when the foldable display device 1 is folded so that the locking rod 202 may be conveniently accommodated into the space formed by the first panel supporting frame 11, the second panel supporting frame 12, and the bending region 103 of the flexible display panel 10 together when the bending region 103 is bent.

In addition, in the embodiments provided by the present disclosure, as shown in FIG. 2 and FIG. 4, the first panel supporting frame 11 is fixed on the display back surface of the first display region 101 of the flexible display panel 10, the second panel supporting frame 12 is fixed on the display back surface of the second display region 102 of the flexible display panel 10, and a length by which the first border 1011 of the first display region 101 protrudes out of the first panel supporting frame 11 and a length by which the fifth border 1021 of the second display region 102 protrudes out of the second panel supporting frame 12 may be adjusted as required.

In the first state of the flexible display panel 10, the display back surface of the first display region 101 and the display back surface of the second display region 102 face towards each other so as to make the flexible display panel 10 perform the double-screen display, and a width of the bending region 103 when the flexible display panel 10 is in the first state enables the first panel supporting frame 11 and the second panel supporting frame 12 to overlap with each other and be attached with each other. According to the above solution, the double-screen display may be realized when the foldable display device 1 is folded, and since the flexible display panel 10 has the certain thickness and tensile force in itself, the bending radius is naturally formed in the bending region 103 when folding the flexible display panel 10, and the width of the bending region 103 of the flexible display panel 10 is determined by the bending radius of the bending region 103.

Figure 5:
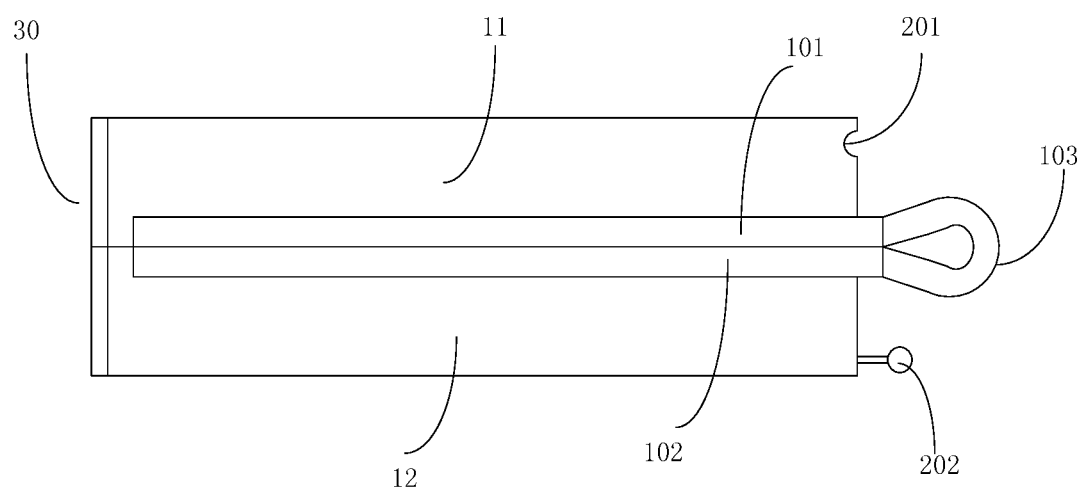
FIG. 5 is a side view of the foldable display device in another folded state provided by the embodiments of the present disclosure.

Optionally, the flexible display panel 10 may further have a third state. The third state is a state in which the flexible display panel 10 is folded. In this state, the first panel supporting frame 11 and the second panel supporting frame 12 overlap with each other, and the bending region 103 is in a third bended-shape. However, as shown in FIG. 5, unlike the first state, when the flexible display panel 10 is in the third state, a display surface of the first display region 101 and a display surface of the second display region 102 overlap with each other and are directly in contact with each other, such that the display surface of the flexible display panel 10 is at an inner side an no display may be performed.

Optionally, the first panel supporting frame 11 includes a second side surface 1102 facing away from the second panel supporting frame 12 in the second state of the flexible display panel 10, and the second panel supporting frame 12 includes a fourth side surface 1202 facing away from the first panel supporting frame 11 in the second state of the flexible display panel 10. The flexible display panel 10 further includes a second locking structure 30. The second locking structure 30 may lock the first panel supporting frame 11 and the second panel supporting frame 12 together in the first state of the flexible display panel 10, and may also lock the first panel supporting frame 11 and the second panel supporting frame 12 in the third state of the flexible display panel 10. A structure of the second locking mechanism 30 may be realized in a plurality of ways. For example, the second locking mechanism 41 may include a locking structure which is on the second side surface 1102 and the fourth side surface 1202 and may be locked or unlocked.

In the foldable display device provided by the present disclosure, the first display region and the second display region may be configured to function as a complete screen together and are driven by different driving circuits, and the bending region may not be used for display. When folding, the first display region and the second display region overlap with each other, and the bending region is bent. When unfolding, the bending region is accommodated in the accommodation space between the first panel supporting frame and the second panel supporting frame, and does not perform display, and a border of the first display region and a border of the second display region abut against each other and form a structure of flat panel display and realize the seamless display.

The above are merely the optional embodiments of the present disclosure. It should be noted that, a person skilled in the art may make various improvements and modifications without departing from the principle of the present disclosure, and these improvements and modifications shall also fall within the scope of the present disclosure.

What is claimed is:
1. A foldable display device, comprising:
   a flexible display panel comprising a first display region, a second display region, and a bending region formed between the first display region and the second display region;
   a first panel supporting frame for supporting the first display region; and
   a second panel supporting frame for supporting the second display region,
   wherein the first panel supporting frame and the second panel supporting frame are configured to make the flexible display panel have a first state and a second state,
   in the first state, the first panel supporting frame and the second panel supporting frame overlap with each other and are directly in contact with each other, the bending region is in a first bended-shape, and the first display region and the second display region overlap with each other and are not directly in contact with each other; and
   in the second state, a surface of the first panel supporting frame in contact with the first display region and a surface of the second panel supporting frame in contact with the second display region are in a same plane, and an accommodation space is formed between the first panel supporting frame and the second panel supporting frame, the bending region is in a second bended-shape and accommodated in the accommodation space, a first border of the first display region and a fifth border of the second display region abut against each other and are in contact with each other to form a structure of flat panel display; and
   a first locking mechanism being on a first side surface of the first panel supporting frame adjacent to the bending region and a third side surface of the second panel supporting frame adjacent to the bending region;

wherein the first locking mechanism comprises:

a locking slot being on the first side surface of the first panel supporting frame; and a locking rod, wherein a first end of the locking rod is on the third side surface of the second panel supporting frame and a rigid ball formed on a second end of the locking rod is configured to be capable of being inserted into or pulled out of the locking slot, wherein in the first state, the second end of the locking rod is pulled out of the locking slot; and in the second state, the second end of the locking rod is inserted into the locking slot so as to lock the first panel supporting frame and the second panel supporting frame.

2. The foldable display device according to claim 1, wherein the first panel supporting frame is on a display back surface of the first display region, and the second panel supporting frame is on a display back surface of the second display region.

3. The foldable display device according to claim 1, wherein the bending region is not configured for display, and comprises a metal connection wire.

4. The foldable display device according to claim 3, wherein, the flexible display panel further comprises:

a first gate driving circuit for driving the first display region, and a second gate driving circuit for driving the second display region and being different from the first gate driving circuit.

5. The foldable display device according to claim 4, wherein the first gate driving circuit is in a vicinity of a second border opposite to the first border of the first display region, and the second gate driving circuit is in a vicinity of a sixth border opposite to the fifth border of the second display region.

6. The foldable display device according to claim 4, wherein at least one of the first gate driving circuit and the second gate driving circuit is in the bending region.

7. The foldable display device according to claim 1, wherein in the first state, the locking rod is capable of being accommodated in a space formed when the bending region is in the first bended-shape; and in the second state, the locking rod is capable of being supported between the first panel supporting frame and the second panel supporting frame such that the first border of the first display region and the fifth border of the second display region abut against each other and are in contact with each other to form the structure of flat panel display.

8. The foldable display device according to claim 1, wherein the locking rod is a stretch-retraction rod structure capable of being stretched and retracted.

9. The foldable display device according to claim 1, wherein in the first state, a display back surface of the first display region and a display back surface of the second display region face towards each other so as to cause the flexible display panel to perform double-screen display, and the bending region has a width enabling the first panel supporting frame and the second panel supporting frame to completely overlap with each other and be attached with each other in the first state.

10. The foldable display device according to claim 1, wherein the flexible display panel further comprises a third state, and in the third state, the first panel supporting frame and the second panel supporting frame overlap with each other, and the bending region is in a third bended-shape, and a display surface of the first display region and a display surface of the second display region overlap with each other and are directly in contact with each other so as to make the flexible display panel not perform display.

11. The foldable display device according to claim 1, wherein the flexible display panel further comprises a second locking mechanism, the first panel supporting frame comprises a second side surface facing away from the second panel supporting frame in the second state, and the second panel supporting frame comprises a fourth side surface facing away from the first panel supporting frame in the second state;

wherein the second locking mechanism is on the second side surface and the fourth side surface, and is configured to lock the first panel supporting frame and the second panel supporting frame in the first state.

12. The foldable display device according to claim 2, wherein the bending region is not configured for display, and comprises a metal connection wire.

13. The foldable display device according to claim 2, further comprising:

a first locking mechanism being on a first side surface of the first panel supporting frame adjacent to the bending region and a third side surface of the second panel supporting frame adjacent to the bending region, and configured to lock the first panel supporting frame and the second panel supporting frame in the second state.

14. The foldable display device according to claim 7, wherein the locking rod is a stretch-retraction rod structure capable of being stretched and retracted.

15. The foldable display device according to claim 2, wherein in the first state, a display back surface of the first display region and a display back surface of the second display region face towards each other so as to cause the flexible display panel to perform double-screen display, and the bending region has a width enabling the first panel supporting frame and the second panel supporting frame to completely overlap with each other and be attached with each other in the first state.

16. The foldable display device according to claim 2, wherein the flexible display panel further comprises a second locking mechanism, the first panel supporting frame comprises a second side surface facing away from the second panel supporting frame in the second state, and the second panel supporting frame comprises a fourth side surface facing away from the first panel supporting frame in the second state;

wherein the second locking mechanism is on the second side surface and the fourth side surface, and is configured to lock the first panel supporting frame and the second panel supporting frame in the first state.

* * * * *